(12) United States Patent  (10) Patent No.: US 8,466,034 B2
Maszara et al.  (45) Date of Patent: Jun. 18, 2013

(54) METHOD OF MANUFACTURING A FINNED SEMICONDUCTOR DEVICE STRUCTURE

(75) Inventors: Witold Maszara, Morgan Hill, CA (US); Robert J. Miller, Yorktown Heights, NY (US)

(73) Assignee: Globalfoundries, Inc., Grand Cayman (KY)

( * ) Notice: Subject to any disclaimer, the term of this patent is extended or adjusted under 35 U.S.C. 154(b) by 589 days.

(21) Appl. No.: 12/749,220

(22) Filed: Mar. 29, 2010

(65) Prior Publication Data
US 2011/0237046 A1   Sep. 29, 2011

(51) Int. Cl.
 *H01L 21/76*   (2006.01)
(52) U.S. Cl.
 USPC .......................... 438/424; 438/197
(58) Field of Classification Search
 USPC ................................ 438/197, 424
 See application file for complete search history.

(56) References Cited

U.S. PATENT DOCUMENTS

| 6,054,355 A | 4/2000 | Inumiya et al. |
|---|---|---|
| 2005/0158934 A1 | 7/2005 | Yun et al. |
| 2005/0255643 A1 * | 11/2005 | Ahn et al. .................... 438/197 |
| 2006/0160302 A1 | 7/2006 | Kim et al. |

OTHER PUBLICATIONS

German Office Action dated Sep. 5, 2012 for Patent Application No. 102011015404.3.

* cited by examiner

*Primary Examiner* — Kimberly Rizkallah
*Assistant Examiner* — Errol Fernandes
(74) *Attorney, Agent, or Firm* — Ingrassia Fisher & Lorenz, P.C.

(57) ABSTRACT

A method of manufacturing a finned semiconductor device structure is provided. The method begins by providing a substrate having bulk semiconductor material. The method continues by forming a semiconductor fin structure from the bulk semiconductor material, depositing an insulating material overlying the semiconductor fin structure such that the insulating material fills space adjacent to the semiconductor fin structure, and planarizing the deposited insulating material and the semiconductor fin structure to create a flat surface. Thereafter, a replacement gate procedure is performed to form a gate structure transversely overlying the semiconductor fin structure.

19 Claims, 18 Drawing Sheets

METHOD OF MANUFACTURING A FINNED SEMICONDUCTOR DEVICE STRUCTURE

TECHNICAL FIELD

Embodiments of the subject matter described herein relate generally to semiconductor devices and related manufacturing processes. More particularly, embodiments of the subject matter relate to methods of forming finned semiconductor devices, such as FinFET devices, in a reliable manner.

BACKGROUND

Transistors, such as metal oxide semiconductor field-effect transistors (MOSFETs), are the core building block of the vast majority of semiconductor devices. Some semiconductor integrated circuits, such as high performance processors or processing units, can include billions of transistors. For such devices, decreasing transistor size, and thus increasing transistor density, has traditionally been a high priority in the semiconductor manufacturing industry.

A FinFET is a type of transistor that can be fabricated using very small scale processes. FIG. 1 is a simplified perspective view of a FinFET 10, which is formed on a semiconductor wafer substrate 12. A FinFET is named for its use of one or more fins 14, which are formed from the semiconductor material of the substrate 12. As shown in FIG. 1, each fin 14 extends between a source region 16 and a drain region 18 of the FinFET 10. The FinFET 10 also includes a gate structure 20 that is formed over and across the fins 14. The surface area of the fins 14 in contact with the gate structure 20 determines the effective channel of the FinFET 10. Semiconductor materials suitable for creating FinFETs include, but are not limited to silicon, germanium, silicon-germanium alloys, and III-V materials such as GaAs, InGaAs, and InP.

BRIEF SUMMARY

A method of manufacturing a finned semiconductor device structure is provided. The method forms a semiconductor fin structure from a layer of semiconductor material, and then deposits an insulating material overlying the semiconductor fin structure such that the insulating material fills space adjacent to the semiconductor fin structure. The method continues by creating a flat surface from the deposited insulating material, such that the flat surface is continuous with an upper surface of the semiconductor fin structure. The method then fabricates a dummy gate structure overlying the flat surface, the dummy gate structure transversely overlying the semiconductor fin structure. The method continues by forming spacers adjacent sidewalls of the dummy gate structure, removing the dummy gate structure while leaving the spacers substantially intact, and selectively etching some of the deposited insulating material below an area defined between the spacers, and in a manner that is self-aligned with the spacers.

Another method of manufacturing a finned semiconductor device structure is also provided. This method begins by providing a substrate having bulk semiconductor material, and by forming a semiconductor fin structure from the bulk semiconductor material. The method continues by depositing an insulating material overlying the semiconductor fin structure such that the insulating material fills space adjacent to the semiconductor fin structure, planarizing the deposited insulating material and the semiconductor fin structure to create a flat surface, and performing a replacement gate procedure to form a gate structure transversely overlying the semiconductor fin structure.

Also provided is yet another method of manufacturing a finned semiconductor device structure. This method provides a substrate having bulk semiconductor material, forms a plurality of semiconductor fin structures from the bulk semiconductor material, and creates isolation trenches in the bulk semiconductor material. The isolation trenches are located between the plurality of semiconductor fin structures. The method continues by filling the isolation trenches and covering the plurality of semiconductor fin structures with an insulating material, creating a flat surface from the deposited insulating material, and performing a replacement gate procedure to form a gate structure transversely overlying the plurality of semiconductor fin structures.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
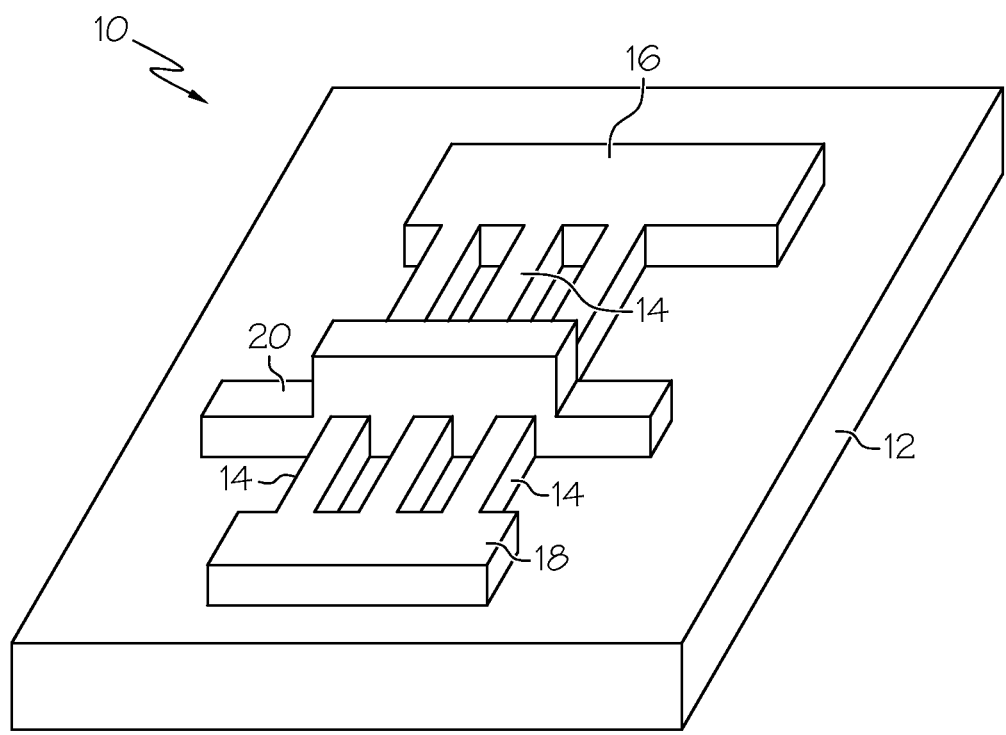
FIG. 1 is a simplified perspective view of a conventional FinFET having a plurality of fins.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Certain terminology may be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" may be used to describe the orientation and/or location of a feature or element within a consistent but arbitrary frame of reference which is made clear by reference to the text and the associated drawings describing the component under discussion. Such terminology may include the words specifically mentioned above, derivatives thereof, and words of similar import.

Techniques and technologies described herein may be utilized to fabricate MOS transistor devices, including NMOS transistor devices, PMOS transistor devices, and NMOS/PMOS device combinations referred to as CMOS devices. Although the term "MOS device" properly refers to a device having a metal gate electrode and an oxide gate insulator, that term will be used throughout to refer to any semiconductor device that includes a conductive gate electrode (whether metal or other conductive material) that is positioned over or around a gate insulator (whether oxide or other insulator) which, in turn, is positioned over a semiconductor region or regions, or around the same as in the case of FinFET devices. Various steps in the manufacture of MOS components and FinFETs are well known and so, in the interest of brevity, many conventional steps will only be mentioned briefly herein or will be omitted entirely without providing the well known process details. As used here, the term "FinFET" refers both to finned devices where only the vertical walls of the fins are influenced by gate voltages (also known as "double gate" or "dual-gate" devices) and to finned devices where the fin top surface as well as the fin vertical walls are influenced by gate voltages (also known as "tri-gate" or "triple gate" devices).

Although the manufacturing process described here can be utilized to create finned semiconductor devices from a bulk semiconductor substrate or a semiconductor-on-insulator (SOI) substrate, certain practical benefits are obtained when bulk semiconductor substrates are used. Therefore, the following description focuses on a bulk semiconductor implementation (in a non-limiting context). The common approach to FinFET formation on a bulk semiconductor substrate employs a fin etch followed by a trench filling step where the trenches (which are formed from the fin etch) are filled with a dielectric material that is subsequently planarized to the upper surfaces of the fin(s). Thereafter, recesses are formed in the planarized dielectric to reveal the desired fin height. For a gate-last approach, a dummy gate stack is formed overlying the revealed fins, and sidewall spacers are formed on the dummy gate stack. Anisotropic etching steps are performed during the fabrication of the dummy gate stack and sidewall spacers. Unfortunately, it can be difficult to achieve uniform, reliable, and consistent etching of the dummy gate stack and the spacers, due to the three dimensional nature of these features (which are formed up and over the semiconductor fins). The fabrication process described below addresses this shortcoming of conventional approaches by forming a dummy gate stack and sidewall spacers on a flat surface, which results in more uniform and reliable etching during formation of those elements. Notably, the flat surface naturally follows from the planarization of the dielectric fill material. Accordingly, the described fabrication process can be easily integrated into existing process flows that utilize a typical gate-last approach.

FIGS. 2-23 are various cross-sectional and top views that illustrate a finned semiconductor device structure and an exemplary process for fabricating it. This fabrication process represents one implementation of a method that is suitable for use in manufacturing finned semiconductor devices, such as FinFETs. An embodiment of this fabrication process may begin by providing an appropriate substrate that is formed from or otherwise comprises a semiconductor material. Preferred embodiments begin with an appropriate bulk substrate of semiconductor material, i.e., a bulk semiconductor substrate. In other embodiments, the substrate is realized as an SOI substrate that includes a support layer, a layer of insulation material overlying or residing on the support layer, and a layer of semiconductor material overlying or residing on the layer of insulation material. The semiconductor material is preferably a silicon material as typically used in the semiconductor industry, e.g., relatively pure silicon as well as silicon admixed with other elements such as germanium, carbon, and the like. Alternatively, the semiconductor material can be germanium, gallium arsenide, or the like. The semiconductor material need not be doped, although it may be very lightly doped as either N-type or P-type, without impacting the manufacturing process described here. For example, bulk silicon substrates are often provided as lightly doped P-type substrates, and a lightly doped P-type semiconductor material could be used for the embodiment described here. Of course, the semiconductor material can be subsequently doped in an appropriate manner to form active regions in a manner that is well understood by those familiar with semiconductor manufacturing techniques.

Figure 2:
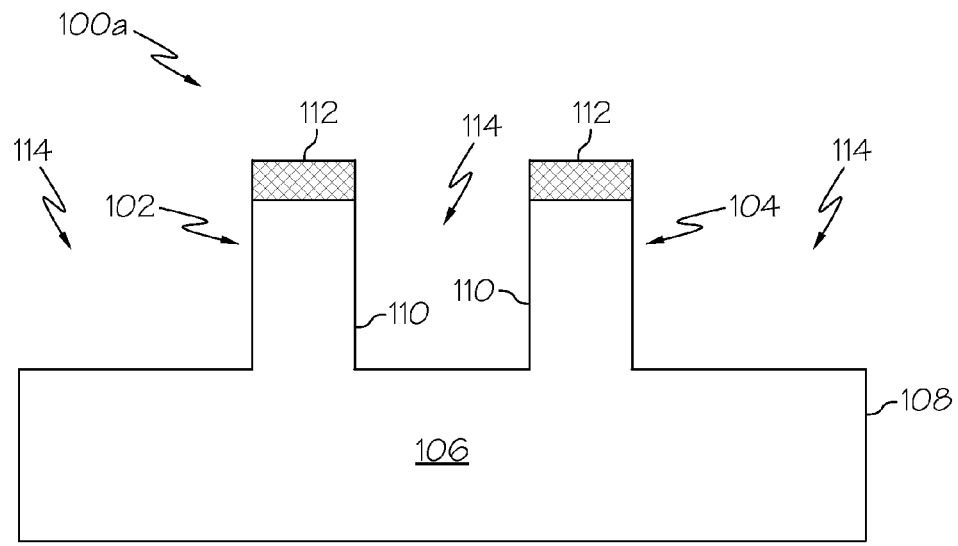
FIGS. 2-23 are various cross-sectional and top views that illustrate a finned semiconductor device structure and an exemplary process for fabricating it.

FIG. 2 is a cross-sectional view of a semiconductor device structure 100a after semiconductor fin structures 102, 104 have been formed from a layer of semiconductor material 106. FIG. 2 represents a view from the perspective of an intersecting plane that is perpendicular to the longitudinal axes of the semiconductor fin structures 102, 104. Accordingly, the longitudinal axes of the semiconductor fin structures 102, 104 runs into and out of the page on which FIG. 2 appears.

For this exemplary embodiment, the layer of semiconductor material 106 was initially provided in the form of a bulk semiconductor substrate 108. Although any number of fin structures could be created, FIG. 2 depicts an exemplary fin arrangement that includes two semiconductor fin structures 102, 104. The semiconductor fin structures 102, 104 can be formed from the layer of semiconductor material 106 using any number of known process steps and techniques. One such method employs photolithography techniques to form a patterned etch mask overlying the layer of semiconductor material 106, typically a patterned hard mask. Thereafter, the semiconductor material 106 is anisotropically etched using the patterned etch mask to define the semiconductor fin structures 102, 104. If the desired fin thickness is too thin for creation by lithography directly, then known methods for creating spacers can be applied in such a manner that spacers composed of nitride or other etch-resistant material become the pattern and hard mask for fin creation. In accordance with certain embodiments, the hard mask material remains on the underlying semiconductor material 106. In this regard, each semiconductor fin structure 102, 104 in FIG. 2 includes a fin 110 formed from the layer of semiconductor material 106, and a hard mask cap 112 overlying the fin 110. In some embodiments, however, the hard mask caps 112 are removed from the fins 110 after etching the semiconductor material 106 to form the semiconductor fin structures 102, 104, or their use is avoided entirely.

When creating the fins 110, the layer of semiconductor material 106 may also be etched in an appropriate manner to create isolation trenches 114 in the bulk semiconductor substrate 108. Although not shown in FIG. 2, the left side of the leftmost isolation trench 114 can be defined with a sidewall of the semiconductor material 106 (and the right side of the rightmost isolation trench 114 can be similarly defined). As is well understood, the isolation trenches 114 are created to accommodate isolation material for purposes of insulating the semiconductor fin structures 102, 104 from one another. Accordingly, the isolation trenches 114 are located between and adjacent to the semiconductor fin structures 102, 104.

For ease of illustration and clarity, FIG. 2 shows an embodiment where the isolation trenches 114 are formed at a single and consistent depth. In practice, however, dual-depth or multiple-depth isolation trenches could be fabricated if so desired. In this regard, a multiple-depth approach may be considered when forming relatively high aspect ratio trenches. For example, a dual-depth approach could be used to form a relatively shallow isolation trench between the two semiconductor fin structures 102, 104, and to form relatively deep isolation trenches outboard the two semiconductor fin structures 102, 104. The remaining manufacturing process steps described below can be performed (with appropriate modification if needed) to accommodate single-depth, dual-depth, or multiple-depth isolation trenches.

As mentioned above, the disclosed semiconductor device fabrication process could be used to create finned devices on an SOI substrate (rather than a bulk substrate). In such embodiments, the process may begin by providing an SOI substrate having a layer of semiconductor material overlying an insulator layer. Using conventional techniques, the layer of semiconductor material is etched to define one or more semiconductor fin structures overlying the insulator layer. In contrast to the bulk implementation described above, formation of fins from an SOI substrate inherently results in the creation of isolation between the fins due to the presence of isolating buried oxide. Nonetheless, the techniques and methodologies described below can still be used to process a semiconductor device structure having fins etched from an SOI substrate.

Figure 3:
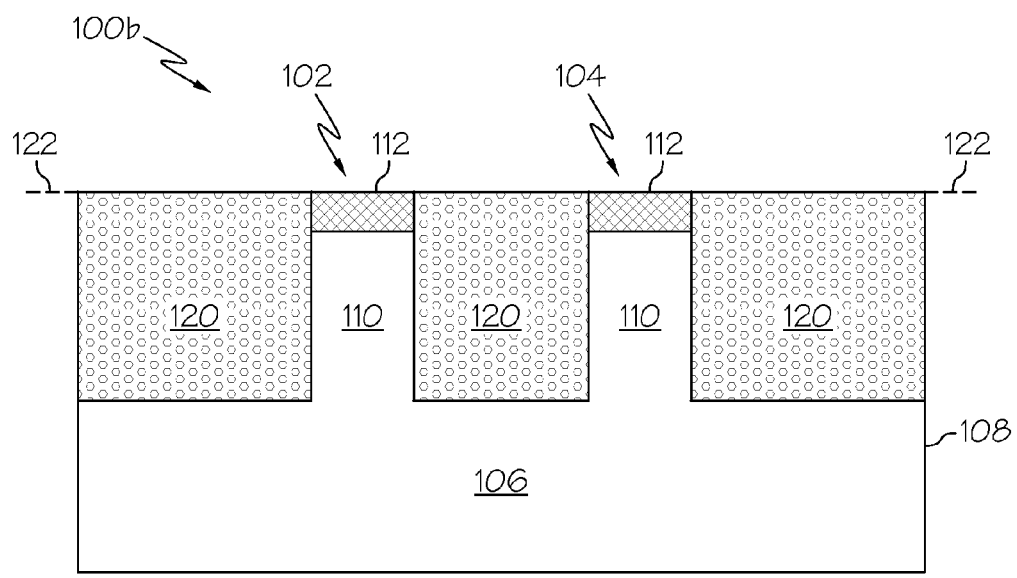

This embodiment of the manufacturing process continues by filling the isolation trenches 114 with an insulating material 120. FIG. 3 depicts the state of the semiconductor device structure 100b after completion of one or more process steps. At this point in the fabrication process, the isolation trenches 114 have been completely filled and overfilled with the insulating material 120 (for example, by deposition), and subsequently the insulating material 120 has been polished or otherwise planarized to create a flat surface 122 from the deposited insulating material 120 and from the upper surfaces of the hard mask caps 112. In FIG. 3, the dashed line represents the flat surface 122, which is continuous with the exposed surface of the deposited insulating material 120 and the exposed upper surfaces of the hard mask caps 112.

In certain embodiments, the insulating material 120 is an oxide material that is blanket deposited overlying the semiconductor fin structures 102, 104 using a well known material deposition technique such as chemical vapor deposition (CVD), low pressure chemical vapor deposition (LPCVD), or plasma enhanced chemical vapor deposition (PECVD). The insulating material 120 is deposited such that it fills the space adjacent to and between the semiconductor fin structures 102, 104 (i.e., the isolation trenches 114 in this example) and covers the hard mask caps 112. Thereafter, the flat surface 122 is created from the deposited insulating material 120. In particular embodiments, the deposited insulating material 120 is planarized using, for example, a chemical mechanical polishing tool and such that the hard mask caps 112 serve as a polish stop indicator. Consequently, the resulting flat surface 122 corresponds to both the exposed surface of the polished insulating material 120 and the exposed upper surfaces of the hard mask caps 112.

For an SOI embodiment, the insulating material can still be deposited between and adjacent to the fins and thereafter planarized to form a flat surface in the manner described above. The resulting structure will be similar to that shown in FIG. 3, however, the insulating material will reside overlying the insulator layer (e.g., a buried oxide layer) of the SOI substrate rather than the bulk semiconductor material.

If a tri-gate device is being fabricated, it may be desirable to remove the hard mask caps 112 prior to the planarizing step, leaving the upper surfaces of the fins 110 unprotected. For that scenario, the insulating material 120 will be polished such that its exposed surface is continuous with the exposed upper surfaces of the fins 110. Alternatively, if the hard mask caps 112 are present at the time of this planarization step, then planarizing the insulating material 120 could be performed such that it results in the removal of the hard mask caps 112 at this time. If the hard mask caps 112 are removed in this manner, then the desired flat surface would correspond to both the exposed polished surface of the insulating material and the exposed upper surfaces of the fins 110. In yet other embodiments, the hard mask caps 112 are removed at some other point during the replacement gate procedure.

Figure 4:
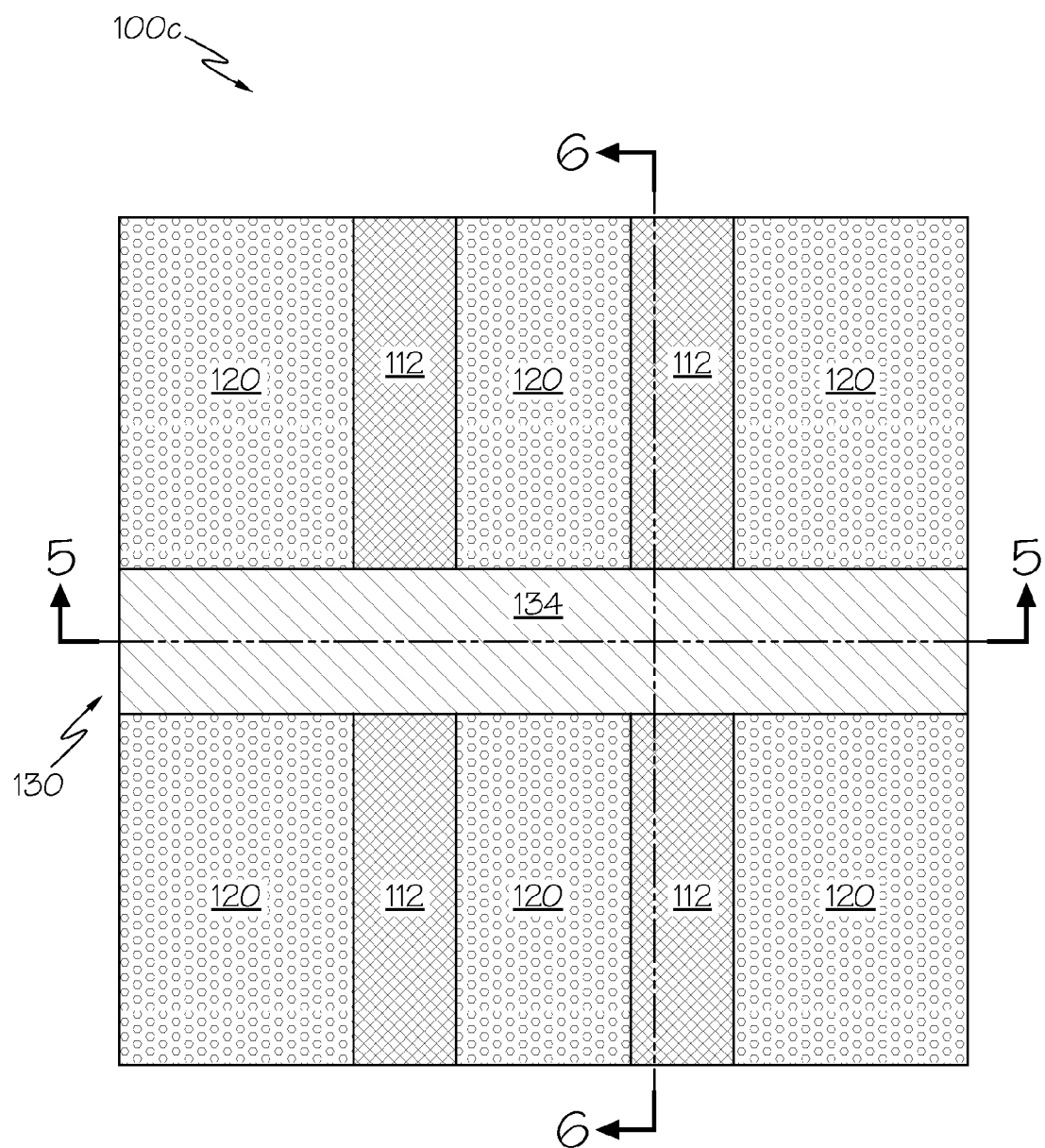
Figure 5:
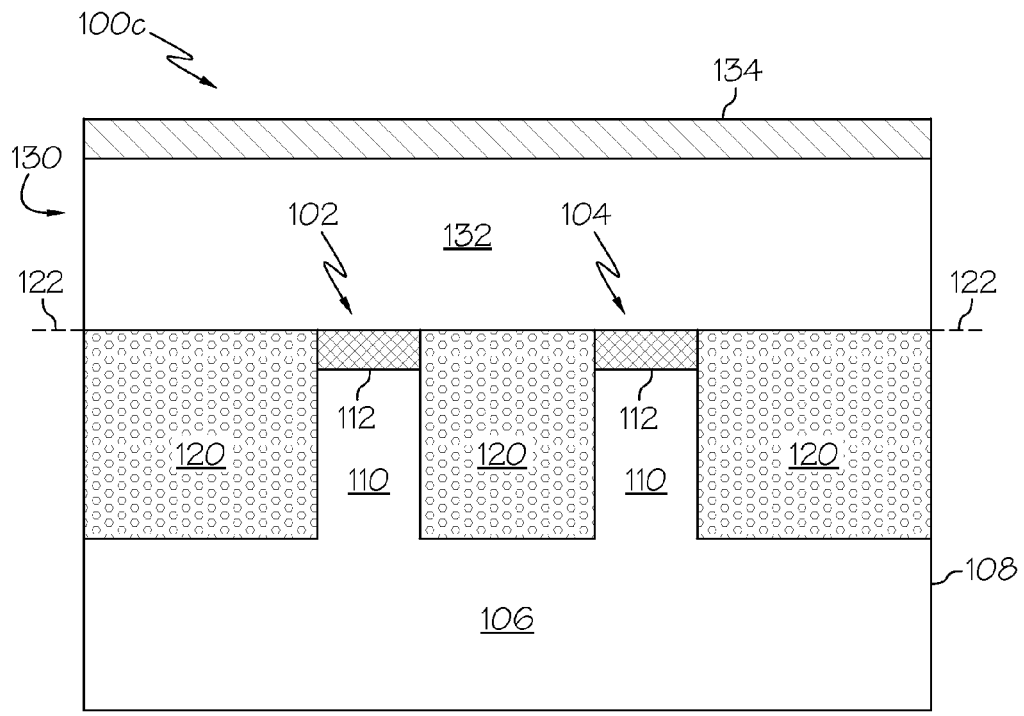
Figure 6:
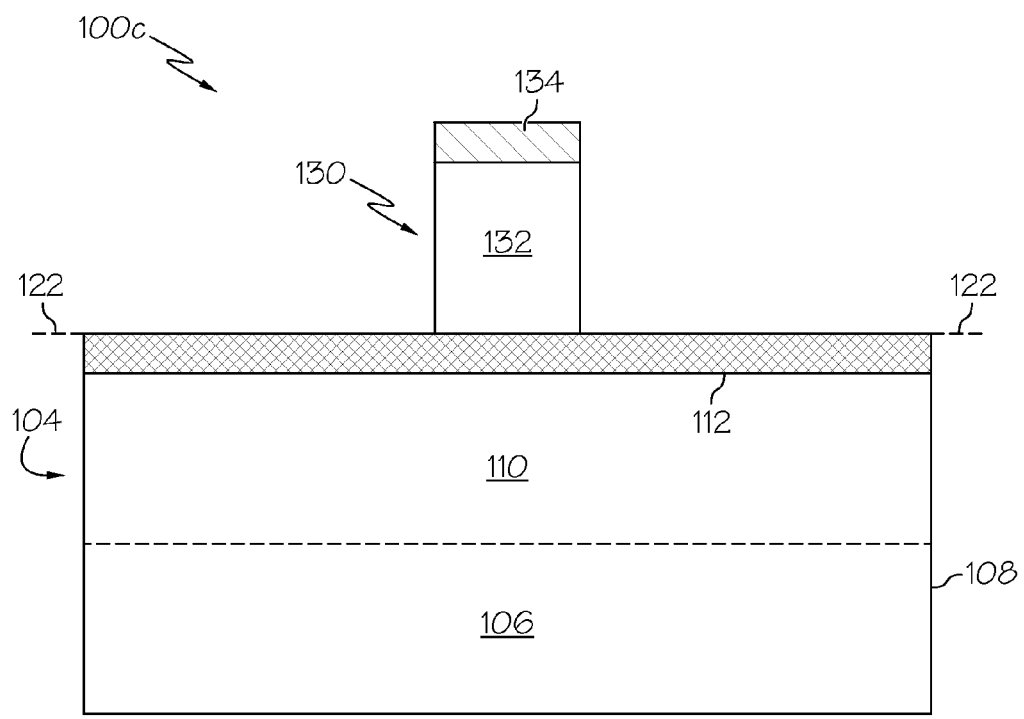

Notably, the flat surface 122 is utilized for a replacement gate procedure to form a gate structure transversely overlying the semiconductor fin structures 102, 104. The replacement gate procedure is performed at this time to take advantage of the flat surface 122, which enables reliable and uniform etching of materials used to fabricate a dummy gate structure and associated sidewall spacers. In this regard, FIGS. 4-6 depict the state of the semiconductor device structure 100c after completion of one or more process steps. More specifically, FIGS. 4-6 show a dummy gate structure 130 overlying the flat surface 122. FIG. 4 is a top view of the semiconductor device structure 100c, FIG. 5 is a cross-sectional view of the semiconductor device structure 100c as viewed from line 5-5 in FIG. 4, and FIG. 6 is a cross-sectional view of the semiconductor device structure 100c as viewed from line 6-6 in FIG. 4. This embodiment of the dummy gate structure 130 includes a dummy gate 132 and a dummy cap 134 overlying the dummy gate 132. As shown in FIG. 4 and FIG. 5, the dummy gate structure 130 is fabricated such that it transversely overlies the semiconductor fin structures 102, 104. For this example, the dummy gate structure 130 is orthogonally oriented relative to the longitudinal axes of the semiconductor fin structures 102, 104.

The dummy gate structure 130 can be fabricated using conventional process steps such as material deposition, photolithography, and etching. In this regard, fabrication of the dummy gate structure 130 may begin by forming at least one layer of dummy gate material overlying the flat surface 122. For this example, the material used for the dummy gate 132 is formed overlying the flat surface 122, and then the hard mask material used for the dummy cap 134 is formed overlying the dummy gate material. The dummy gate material is typically a polycrystalline silicon material, and the hard mask material is typically a nitride material or an oxide material. In typical embodiments, the dummy gate materials are blanket deposited on the semiconductor device structure in a conformal manner (using, for example, any of the deposition techniques mentioned previously).

The hard mask layer is photolithographically patterned to form a dummy gate etch mask, and the underlying dummy gate material is anisotropically etched into the desired topology that is defined by the dummy gate etch mask. The resulting dummy gate 130 is depicted in FIGS. 4-6. Notably, anisotropic etching of the dummy gate materials can be controlled in a reliable manner to produce uniform etching, because the dummy gate 130 resides on the flat surface 122. In other words, the vertical dimension of the dummy gate materials is relatively uniform and constant overlying the flat surface 122, which is desirable to achieve accurate and uniform anisotropic etching in the vertical direction.

Figure 7:
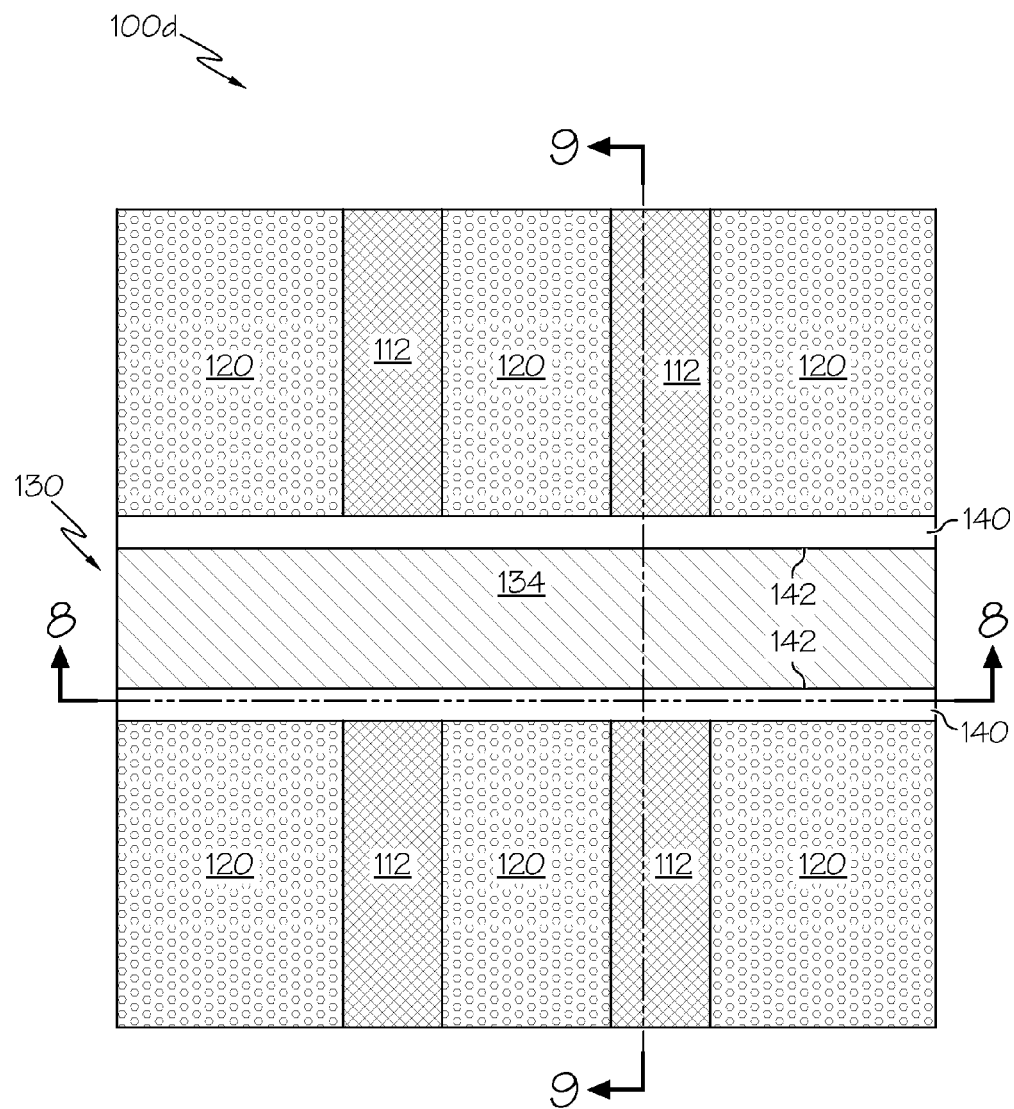
Figure 8:
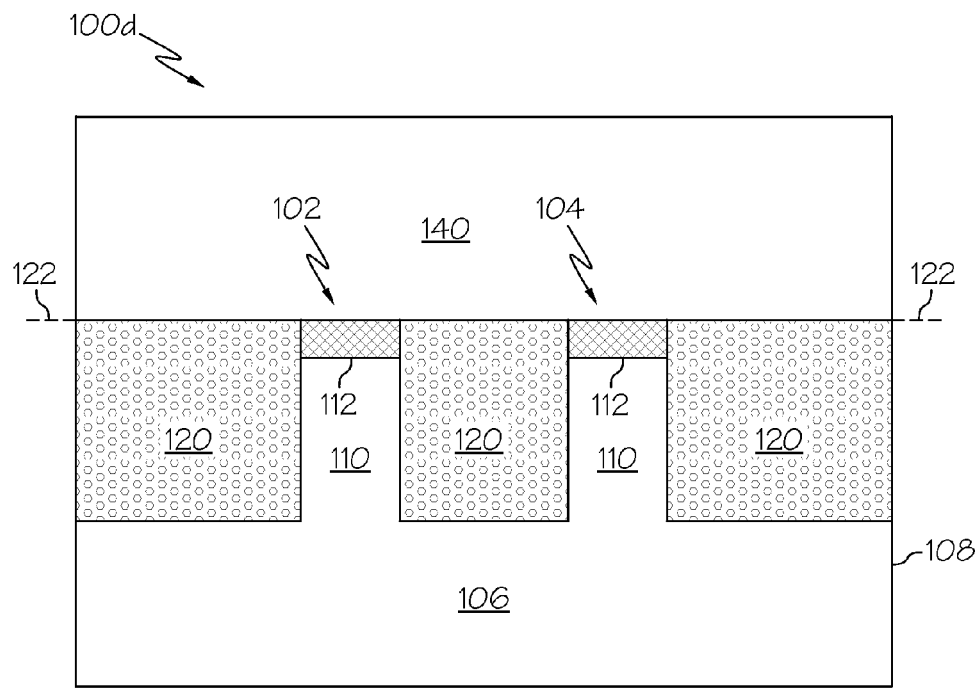
Figure 9:
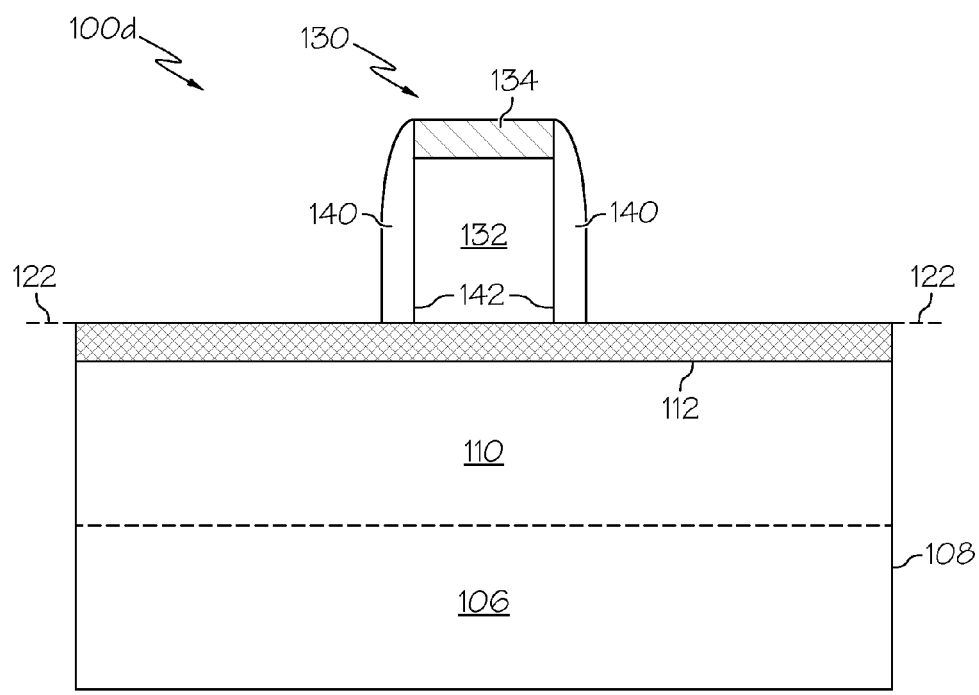

After the dummy gate structure 130 has been created, the process may continue by forming spacers adjacent the sidewalls of the dummy gate structure 130. In this regard, FIGS. 7-9 depict the state of the semiconductor device structure 100d after the formation of the spacers 140. FIG. 7 is a top view of the semiconductor device structure 100d, FIG. 8 is a cross-sectional view of the semiconductor device structure 100d as viewed from line 8-8 in FIG. 7, and FIG. 9 is a cross-sectional view of the semiconductor device structure 100d as viewed from line 9-9 in FIG. 7. As shown in FIG. 7 and FIG. 9, the spacers 140 are formed adjacent to and on the sidewalls 142 of the dummy gate structure 130.

The spacers 140 can be fabricated using conventional process steps such as material deposition, photolithography, and etching. In this regard, formation of the spacers 140 may begin by conformally depositing a spacer material overlying the dummy gate structure 130. The spacer material is an appropriate insulator, such as silicon oxide or silicon nitride, and the spacer material can be deposited in a known manner by, for example, atomic layer deposition (ALD), CVD, LPCVD, semi-atmospheric chemical vapor deposition (SACVD), or PECVD. The spacer material is deposited to a thickness so that, after anisotropic etching, the spacers 140 have a thickness that is appropriate for the subsequent etching steps described below.

Thereafter, the spacer material is anisotropically and selectively etched to define the spacers 140. In practice, the spacer material can be etched by, for example, reactive ion etching (RIE) using a suitable etching chemistry. Notably, anisotropic etching of the spacer material can be controlled in a reliable manner to produce uniform etching, because the dummy gate 130 and the spacer material resides on the flat surface 122, which facilitates accurate and uniform anisotropic etching in the vertical direction.

Figure 10:
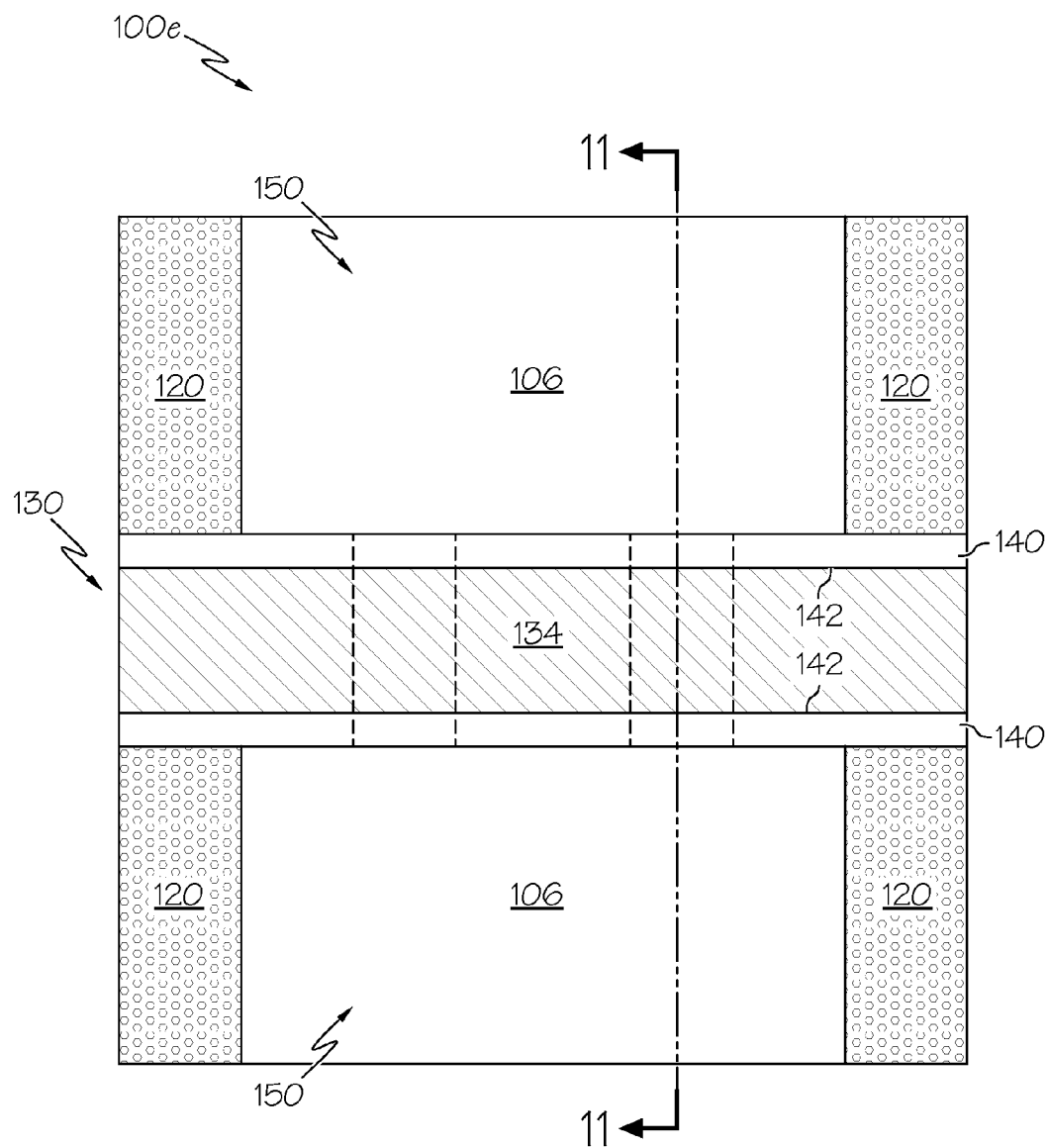
Figure 11:
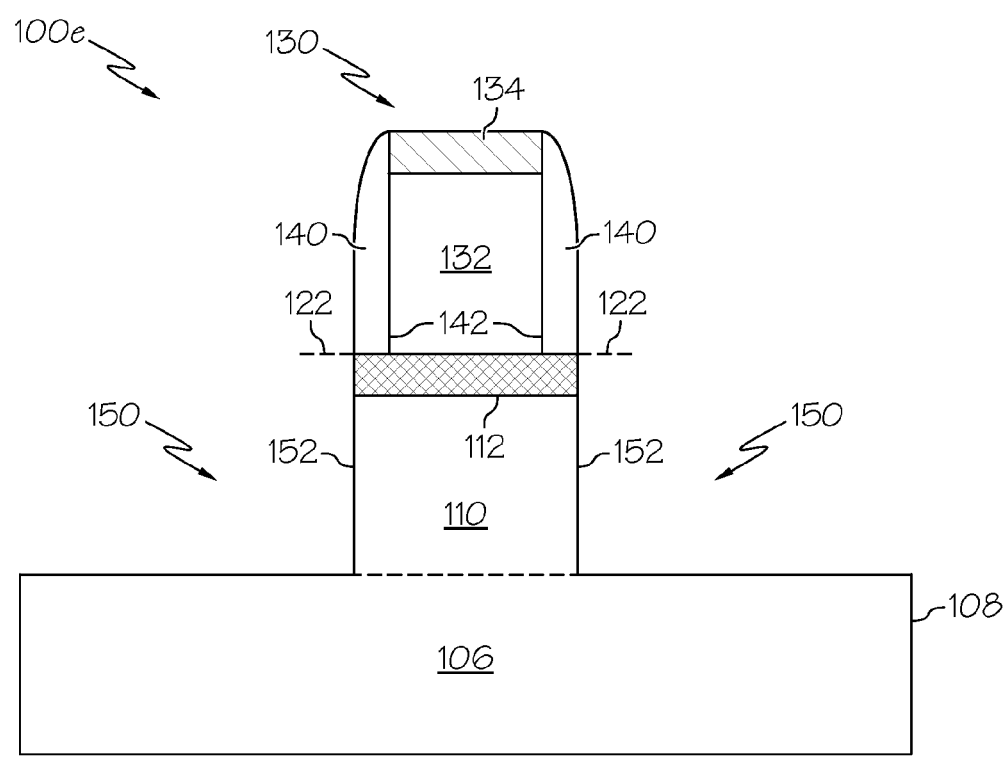

After the spacers 140 have been created, this exemplary process continues by forming source/drain cavities in the semiconductor device structure. FIG. 10 and FIG. 11 depict the state of the semiconductor device structure 100e after the formation of the source/drain cavities 150. FIG. 10 is a top view of the semiconductor device structure 100e, and FIG. 11 is a cross-sectional view of the semiconductor device structure 100e as viewed from line 11-11 in FIG. 10. It should be appreciated that the cross-sectional view of the semiconductor device structure 100e taken longitudinally through the dummy gate 130 will still appear as shown in FIG. 5.

The source/drain cavities 150 are formed by sequentially or concurrently etching unprotected portions of the hard mask caps 112, the fins 110, and the insulating material 120 to the desired depth. For reasons that will become apparent later, the source/drain cavities 150 are etched such that no insulating material 120 remains overlying the semiconductor material 106 at the bottom of the source/drain cavities 150. This option would be typically used in conjunction with shallow isolation trenches between fins, while deeper isolation would separate individual devices. Such a source/drain cavity type affords more controlled epitaxial processes (seeding on planar and flat substrate material) and possibly better coupling of the stress, which is caused by the epitaxial material grown in the cavity, with the device channel. Notably, the dummy cap 134 and the spacers 140 may function as part of an etch mask during the creation of the source/drain cavities 150. Although not shown, appropriately patterned etch mask material may also be used to protect certain areas of the insulating material 120 during the etching steps. For this embodiment, the sides of the source/drain cavities 150 are defined by regions of the insulating material 120 that were protected by an etch mask during the etching steps (see FIG. 10). As depicted in FIG. 11, the source/drain cavities 150 are anisotropically etched such that the sidewalls 152 of the source/drain cavities 150 are self-aligned with the spacers 140.

Figure 12:
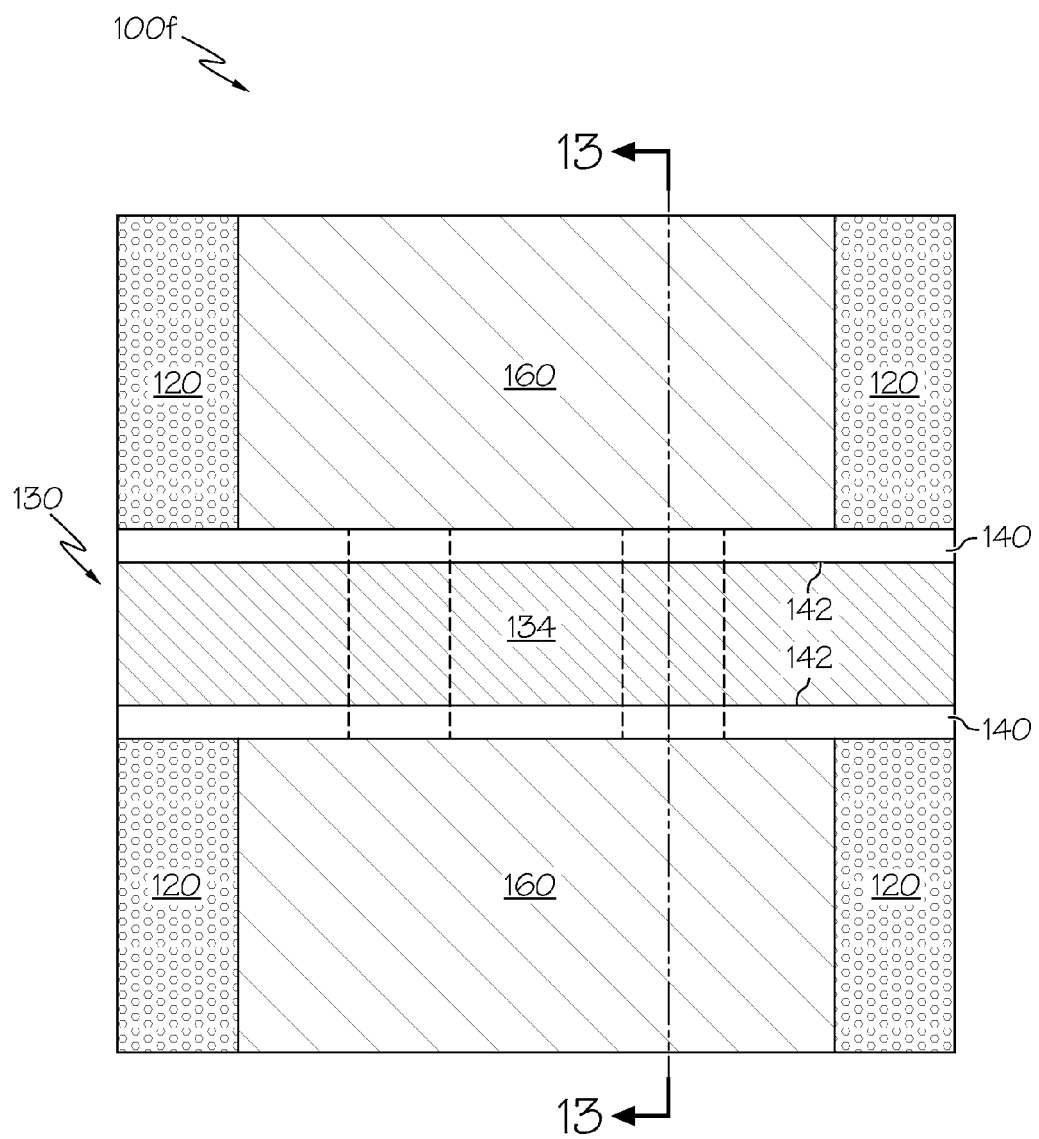
Figure 13:
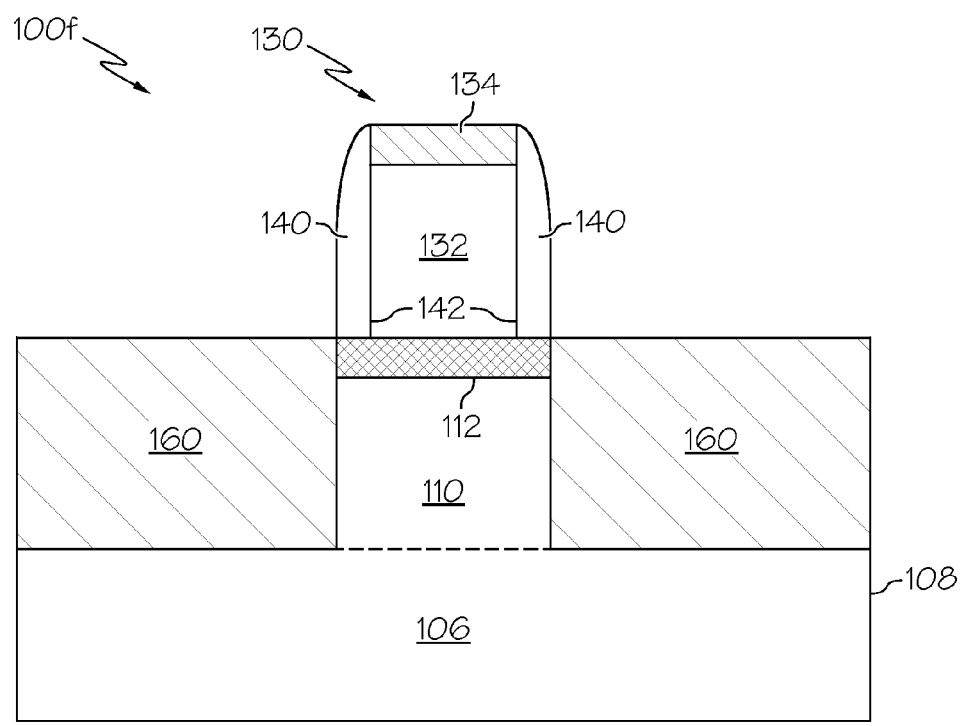

The manufacturing process may proceed by at least partially filling the source/drain cavities 150 with semiconductor material. FIG. 12 and FIG. 13 depict the state of the semiconductor device structure 100f after the source/drain cavities 150 have been filled with a semiconductor material 160. FIG. 12 is a top view of the semiconductor device structure 100f, and FIG. 13 is a cross-sectional view of the semiconductor device structure 100f as viewed from line 13-13 in FIG. 12. It should be appreciated that the cross-sectional view of the semiconductor device structure 100f taken longitudinally through the dummy gate 130 will still appear as shown in FIG. 5.

The semiconductor material 160 may be a silicon material, a stress inducing semiconductor material, or the like. In this embodiment, the semiconductor material 160 is a stress inducing semiconductor material that is formed by selectively epitaxially growing a silicon based material in the source/drain cavities 150. For an NMOS transistor device, the semiconductor material 160 is a semiconductor material, such as silicon carbon, or another material that has a lower lattice constant than silicon. In contrast, for a PMOS transistor device, the semiconductor material 160 is a semiconductor material, such as silicon germanium, or another material that has a higher lattice constant than silicon. As is well understood, such epitaxial growth occurs from the semiconductor material 106 present at the bottom of the source/drain cavities 150. This is why all of the insulating material 120 is removed from the region of the source/drain cavities 150. In certain embodiments, the semiconductor material 160 is an "in situ doped" material in that a suitable dopant is introduced into a host material as that host material is grown. Epitaxially grown in situ doped silicon material may be utilized here such that the material need not be subjected to ion implantation for purposes of doping.

It should be appreciated that the use of the stress inducing semiconductor material 160 is optional. As an alternative, the fins 110 can be partially or fully exposed in the source/drain regions, and silicon (which is not stress inducing) can be epitaxially grown in the source/drain regions as desired to thicken the fins 110 and/or to merge the fins 110 together. Such treatment is typically performed to decrease the contact resistance of the fins 110 and to accommodate the formation of source/drain contacts at the ends of the fins 110.

Referring again to FIG. 12 and FIG. 13, the semiconductor material 160 could be subjected to ion implantation (for source/drain doping) at this time if so desired. As another optional step, the semiconductor material 160 could be subjected to a silicidation process to form the source/drain contact areas at this time. Alternatively, ion implantation and/or silicidation could be performed later during the fabrication process.

Figure 14:
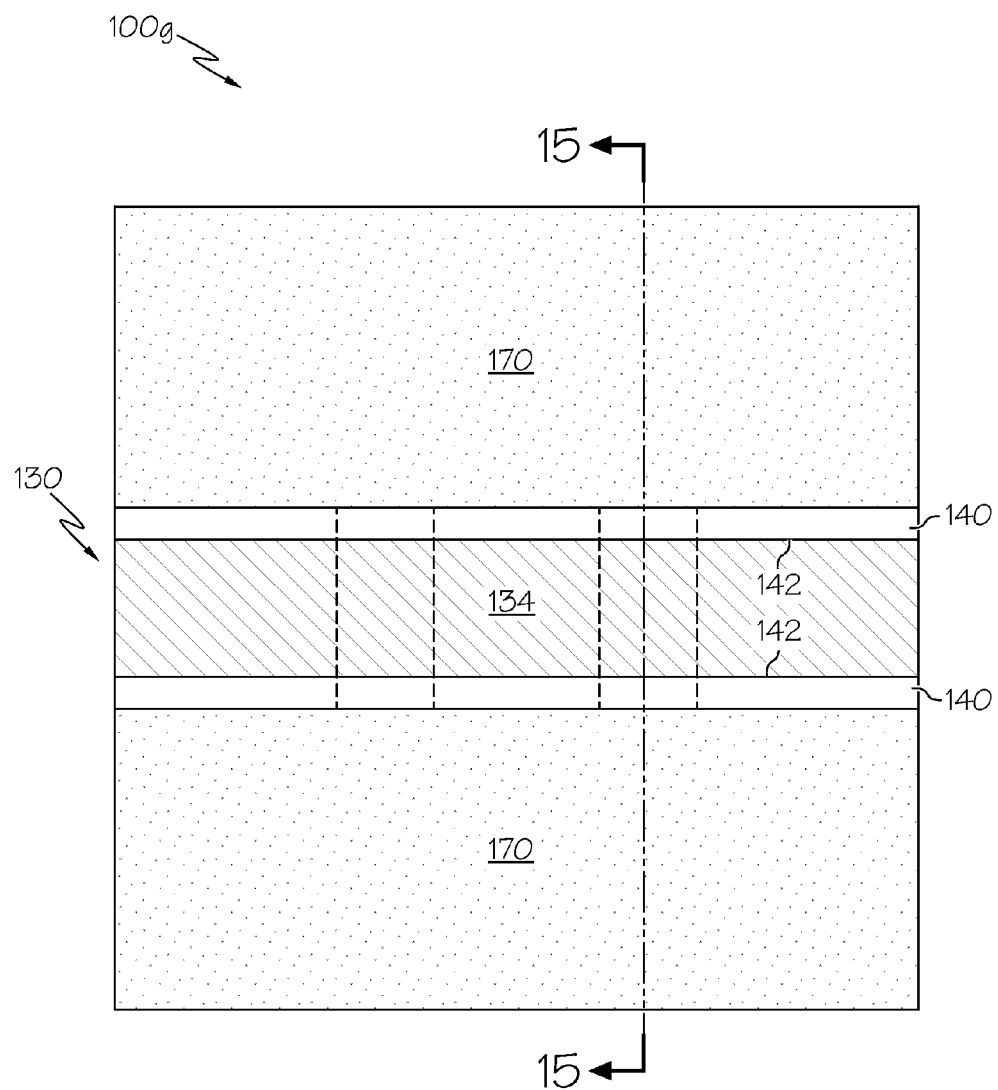
Figure 15:
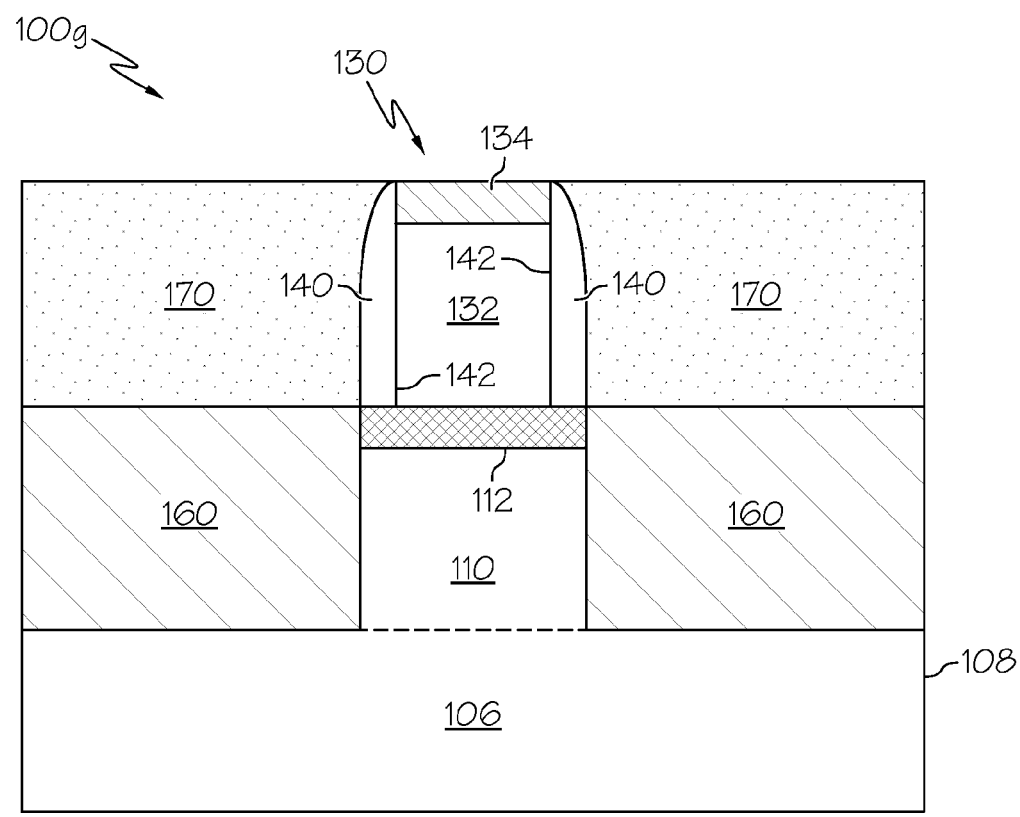

The manufacturing process may proceed by forming regions of dielectric material outboard the spacers 140. FIG. 14 and FIG. 15 depict the state of the semiconductor device structure 100g after this dielectric material 170 has been formed. FIG. 14 is a top view of the semiconductor device structure 100g, and FIG. 15 is a cross-sectional view of the semiconductor device structure 100g as viewed from line 15-15 in FIG. 14. It should be appreciated that the cross-sectional view of the semiconductor device structure 100g taken longitudinally through the dummy gate 130 will still appear as shown in FIG. 5. At this point in the fabrication process, previously unoccupied spaces outboard the spacers 140 have been completely filled with the dielectric material 170 (for example, by blanket deposition), and the exposed surface of the semiconductor device structure 100g has been polished or otherwise planarized as depicted in FIG. 15.

In certain embodiments, the dielectric material 170 is an interlayer dielectric (ILD) material that is initially blanket deposited overlying the semiconductor material 160, the dummy gate structure 130, and the spacers 140 using a well known material deposition technique such as chemical vapor deposition (CVD), low pressure chemical vapor deposition (LPCVD), or plasma enhanced chemical vapor deposition (PECVD). The dielectric material 170 is deposited such that it fills the spaces adjacent to and outboard the spacers 140 and such that it covers the spacers 140 and the dummy cap 134. Thereafter, the deposited dielectric material 170 is planarized using, for example, a chemical mechanical polishing tool and such that the dummy cap 134 serves as a polish stop indicator.

Figure 16:
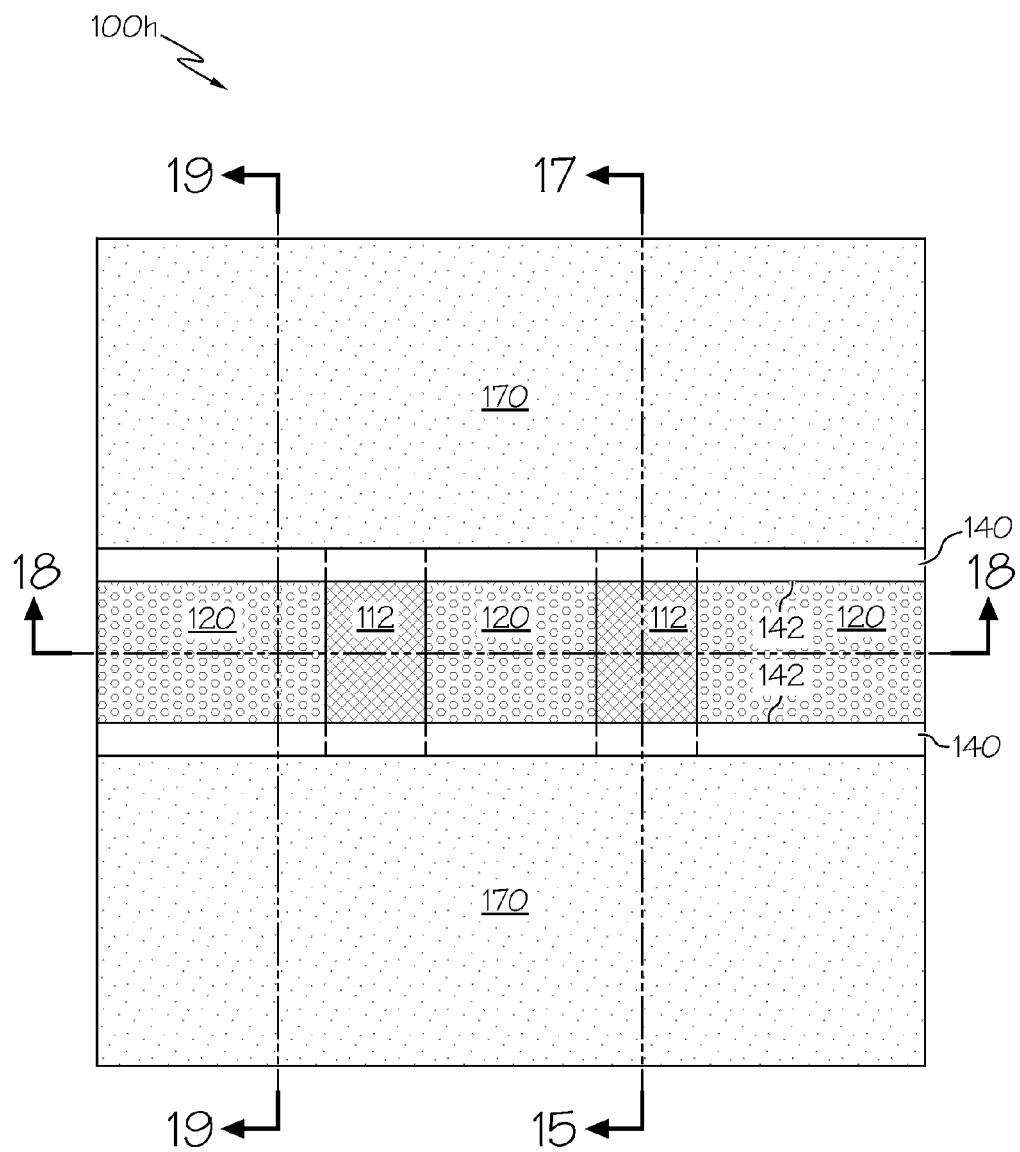
Figure 17:
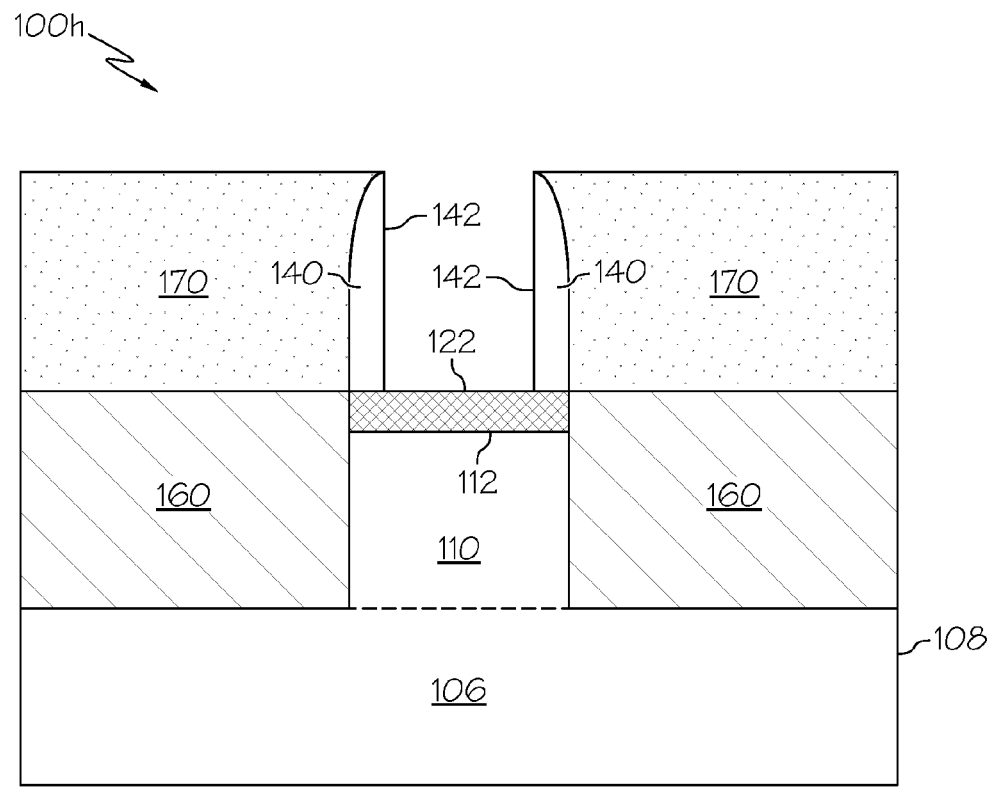

The fabrication process may proceed by removing the dummy gate structure 130 while leaving the spacers 140 intact or at least substantially intact. FIG. 16 and FIG. 17 depict the state of the semiconductor device structure 100h after removal of the dummy gate structure 130. FIG. 16 is a top view of the semiconductor device structure 100h, and FIG. 17 is a cross-sectional view of the semiconductor device structure 100h as viewed from line 17-17 in FIG. 16. Notably, removal of the dummy gate structures 130 results in the removal of the dummy cap 134 (assuming that it is still present at this time) and the removal of the dummy gate 132. Accordingly, removal of the dummy gate structure 130 exposes the flat surface 122 between the spacers 140 (see FIG. 17). Thus, sections of the hard mask caps 112 and sections of the insulating material 120 (that were previously covered by the dummy gate structures 130) will be exposed. It should therefore be appreciated that the cross-sectional view of the semiconductor device structure 100h taken longitudinally between the spacers 140 will appear as shown in FIG. 3.

In certain embodiments, the dummy gate structure 130 is removed by sequentially or concurrently etching the dummy cap 134 and the dummy gate 132 in a selective manner, stopping at the desired point. The etching chemistry and technology used for this etching step is chosen such that the spacers 140 and the dielectric material 170 are not etched (or only etched by an insignificant amount). Depending upon the particular process, etching of the dummy gate 130 may be controlled to stop at the hard mask caps 112 (if they are still present at this time) or at the top of the fins 110.

Figure 18:
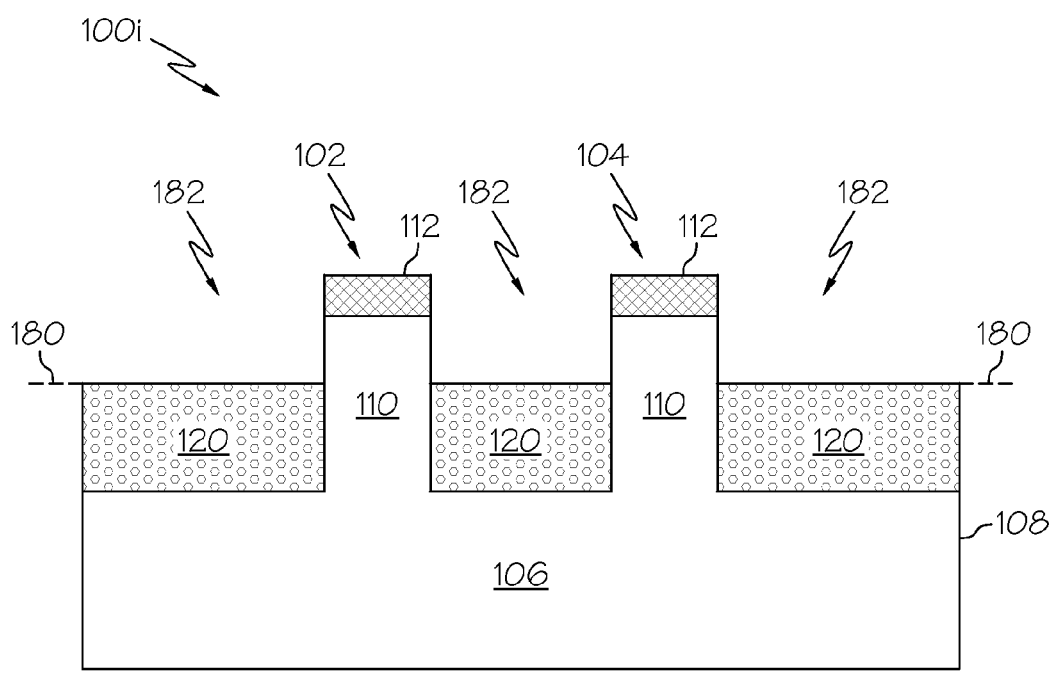
Figure 19:
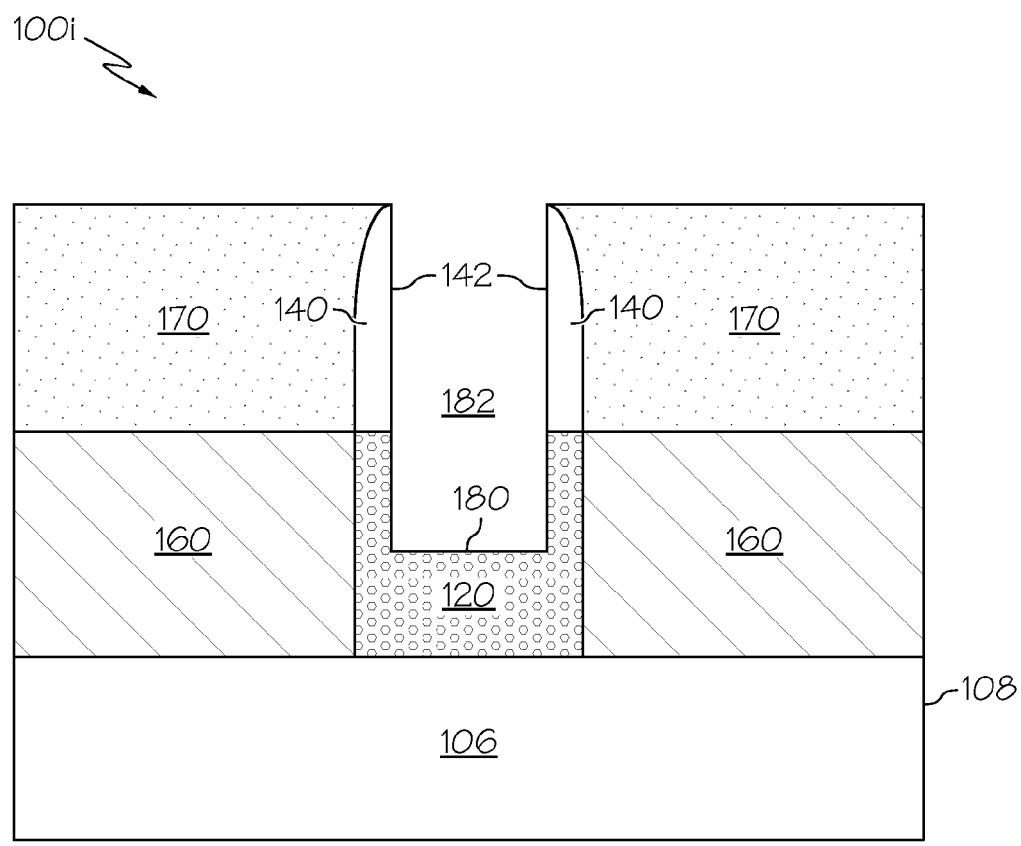

The manufacturing process may proceed by removing some of the exposed insulating material 120 to define the desired height of the fins 110. FIG. 18 and FIG. 19 depict the state of the semiconductor device structure 100i after the height of the insulating material 120 has been reduced. For this particular example, the hard mask caps 112 of the semiconductor fin structures 102, 104 remain intact. Accordingly, the top view of the semiconductor device structure 100i will resemble that depicted in FIG. 16 (because the height of the insulating material 120 is not distinguishable in FIG. 16). For this reason, FIG. 18 is a cross-sectional view of the semiconductor device structure 100i as viewed from line 18-18 in FIG. 16, and FIG. 19 is a cross-sectional view of the semiconductor device structure 100i as viewed from line 19-19 in FIG. 16. Notably, FIG. 18 corresponds to a section through the semiconductor fin structure 104, and FIG. 19 corresponds to a section adjacent to the semiconductor fin structure 102. For this embodiment, a section taken adjacent to the semiconductor fin structure 104 and a section taken between the semiconductor fin structures 102, 104 would also appear as shown in FIG. 19.

If a tri-gate device is being fabricated, then the hard mask caps 112 may also be removed at this time. In such embodiments, the top view of the device structure at this point in the process would be similar to that shown in FIG. 16, however, the fins 110 would be visible instead of the hard mask caps 112. Likewise, the hard mask caps 112 would not appear in FIG. 18.

In certain embodiments, the insulating material 120 is partially removed using a selective and anisotropic etching technique. In this regard, the insulating material 120 is preferably etched using an appropriate etch chemistry that is selective to the insulating material 120, and such that the dielectric material 170, the spacers 140, the hard mask caps 112, and the fins 110 remain intact (or such that these items are preserved with only an insignificant amount of etching). Note that the spacers 140 serve as a self-aligning etch mask while the insulating material 120 is being anisotropically etched. Accordingly, the portion of the insulating material 120 that is located below the area defined between the spacers 140 is etched in a self-aligned manner. Moreover, the selective etching of the insulating material 120 is controlled such that an isolating layer of the deposited insulating material 120 remains overlying the semiconductor material 106 and between the semiconductor fin structures 102, 104 (see FIG. 18). This remaining insulating material 120 isolates the semiconductor fin structures 102, 104 from one another.

As shown in FIG. 18 and FIG. 19, etching of the insulating material 120 reduces its height such that upper portions of the fins 110 are exposed and "protruding" from the newly formed upper surface 180 of the insulating material 120 (for comparison, see FIG. 5). The selective etching of the insulating material 120 defines and forms a gate space 182 for the semiconductor device structure 100i. Referring to FIGS. 16, 18, and 19, this gate space 182 is located overlying the insulating material 120, overlying the semiconductor fin structures 102, 104, and between the spacers 140. Moreover, the spacers 140 protect the underlying insulating material 120, thus forming thin "walls" of the insulating material 120 that separate the gate space 182 from the outboard semiconductor material 160 (see FIG. 19).

Figure 20:
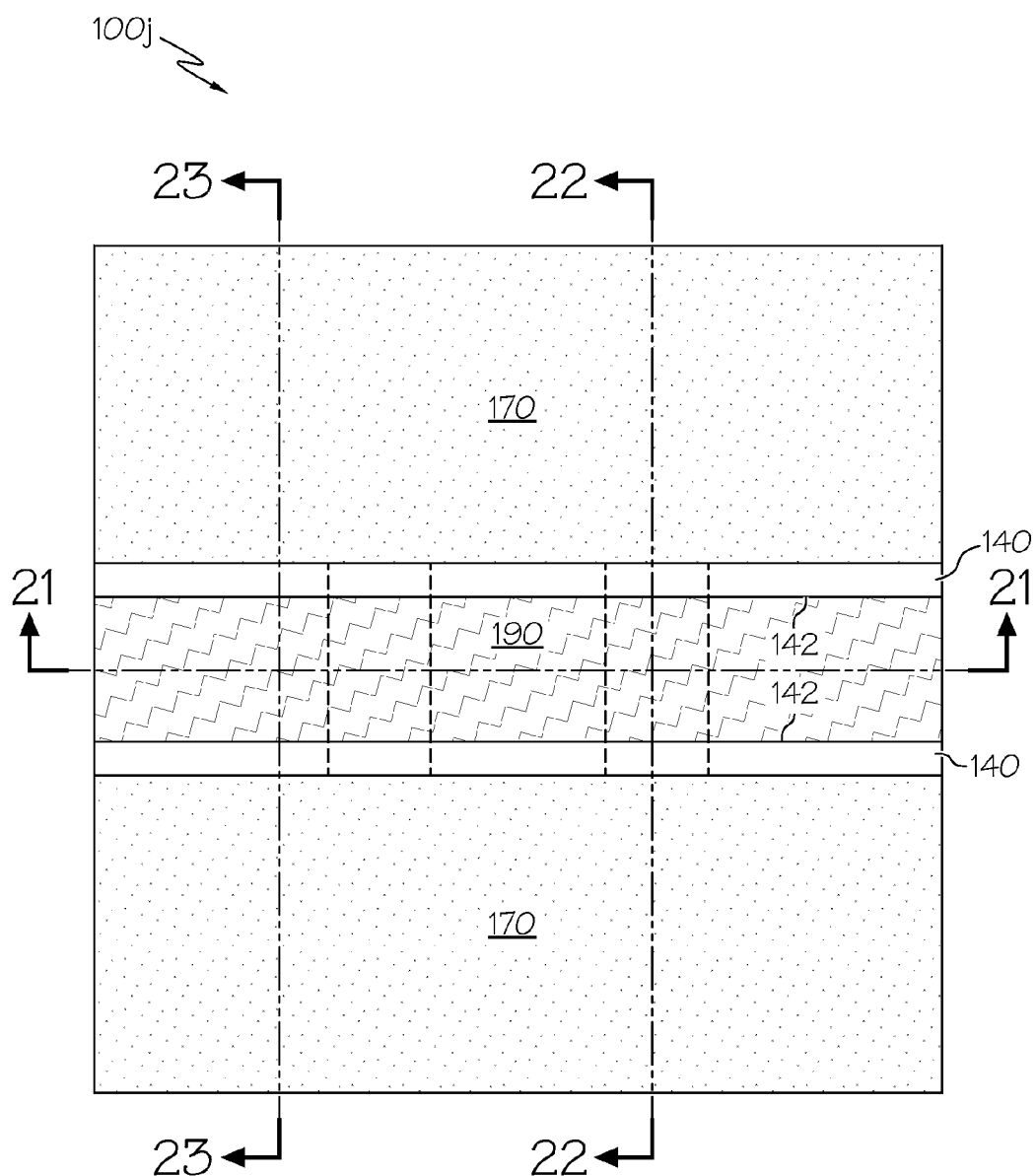
Figure 21:
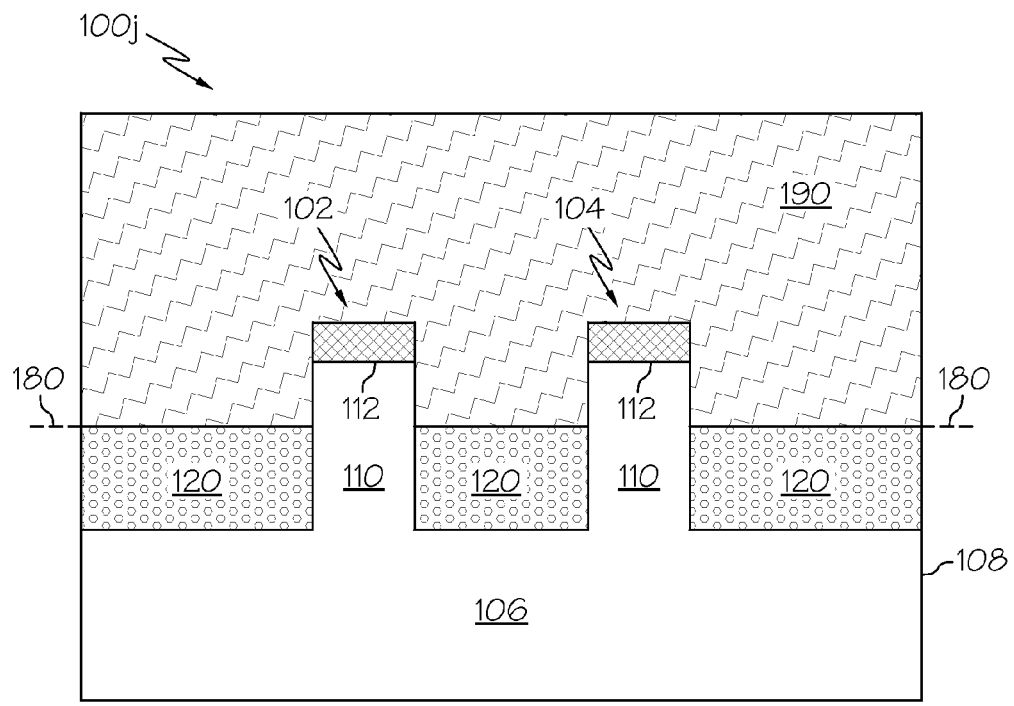
Figure 22:
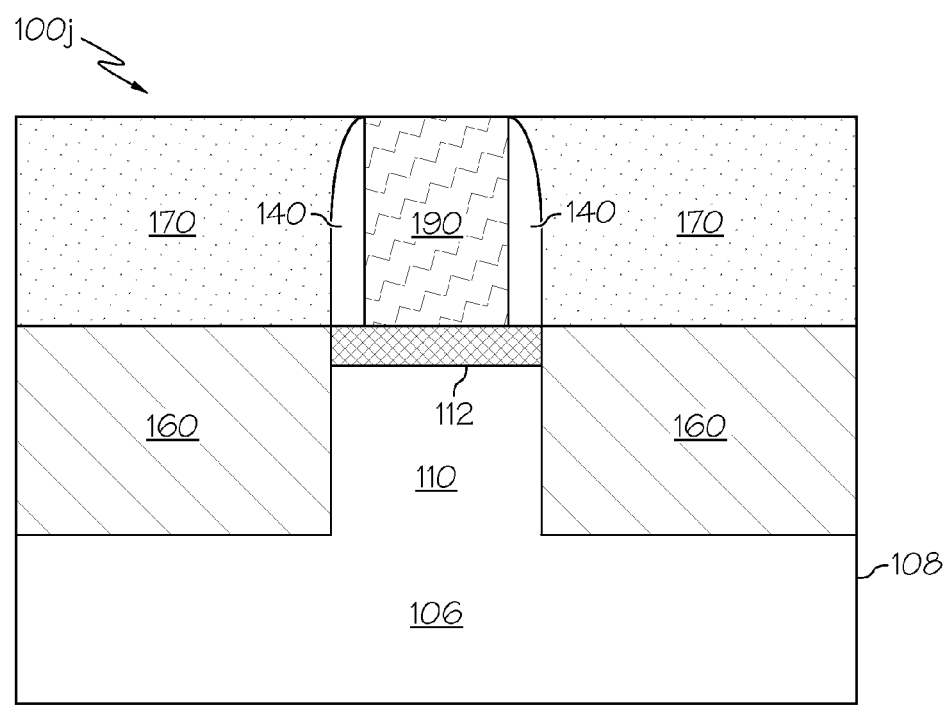
Figure 23:
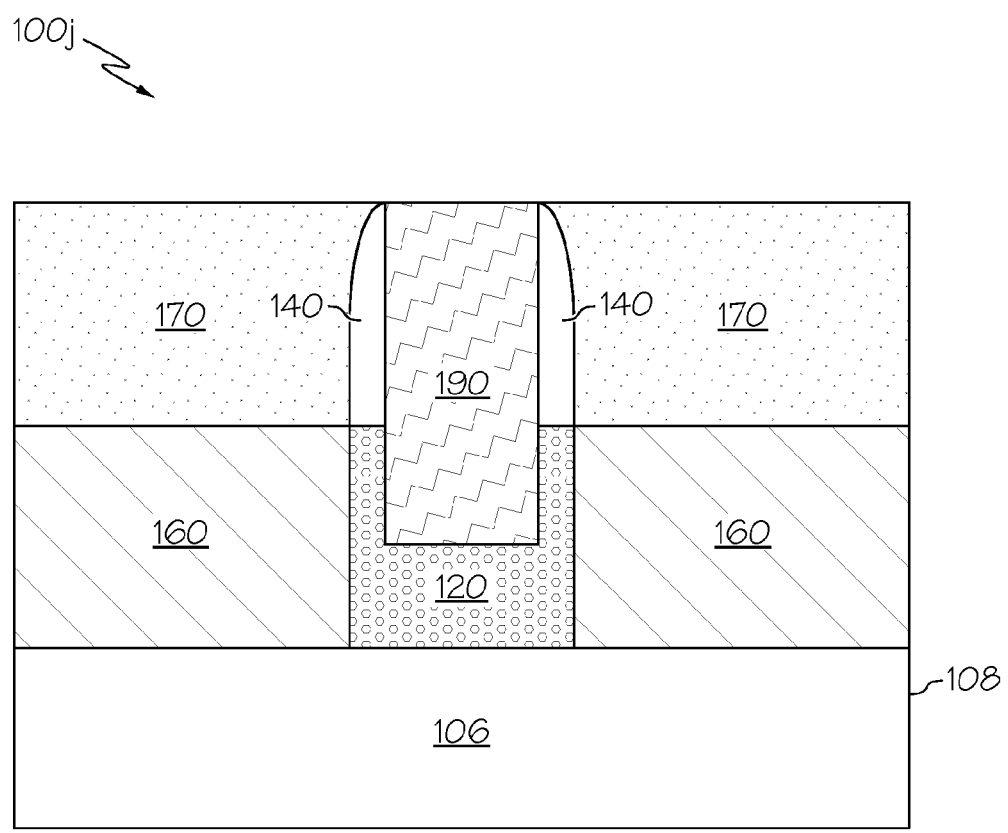

This exemplary fabrication process continues by forming a gate structure that occupies the gate space 182 and the area defined between the spacers 140. FIGS. 20-23 depict the state of the semiconductor device structure 100j after creation of an exemplary gate structure 190. FIG. 20 is a top view of the semiconductor device structure 100j, FIG. 21 is a cross-sectional view of the semiconductor device structure 100j as viewed from line 21-21 in FIG. 20, FIG. 22 is a cross-sectional view of the semiconductor device structure 100j as viewed from line 22-22 in FIG. 20 (i.e., taken through the semiconductor fin structure 104), and FIG. 23 is a cross-sectional view of the semiconductor device structure 100j as viewed from line 23-23 in FIG. 20 (i.e., taken through a section adjacent the semiconductor fin structure 102).

FIGS. 20-23 illustrate how the completed gate structure 190 fills the gate space 182 and the area between the spacers 140. As is well understood, the gate structure 190 is formed overlying the semiconductor fin structures 102, 104 such that the gate structure 190 contacts the vertical sides of the fins 110. The illustrated embodiment represents a dual-gate device wherein the hard mask caps 112 remain at the tips of the fins 110. Accordingly, as shown in FIG. 21, the gate structure 190 is formed overlying the insulating material 120, the fins 110, and the hard mask caps 112. Alternatively, the hard mask caps 112 could be removed prior to formation of the gate structure 190, resulting in a tri-gate device structure. In accordance with conventional replacement gate procedures, the top view of the gate structure 190 (see FIG. 20) follows the same layout as the dummy gate structure 130 (see FIG. 14). In this regard, the gate structure 190 is fabricated such that it transversely overlies the semiconductor fin structures 102, 104. For this example, the gate structure 190 is orthogonally oriented relative to the longitudinal axes of the semiconductor fin structures 102, 104.

The gate structure 190 can be fabricated using conventional process steps such as material deposition, photolithography, and etching. Moreover, the gate structure 190 could be formed using any established gate module technology (e.g., a gate insulator combined with a polycrystalline gate electrode, a high-k metal gate arrangement, or the like). In practice, fabrication of the gate structure 190 may begin by forming at least one layer of gate material overlying the semiconductor device structure 100i shown in FIG. 18 and FIG. 19. In typical embodiments, the various layers of gate materials are blanket deposited on the semiconductor device structure in a conformal manner (using, for example, any of the deposition techniques mentioned previously).

The deposited gate material can then be planarized using, for example, a chemical mechanical polishing tool. For the illustrated embodiment, the deposited gate material is polished until it is even with the upper tips of the spacers 140, and such that any overfill material is removed from the upper surface of the dielectric material 170 (see FIG. 22 and FIG. 23). In practice, the spacers 140 and/or the dielectric material 170 could serve as a polish stop indicator during this step. Ultimately, the gate structure 190 is formed as a result of these fabrication steps.

Thereafter, any number of known process steps can be performed to complete the fabrication of one or more semiconductor devices that incorporate the semiconductor fin structures 102, 104. For example, the manufacturing process can be carried out to complete the fabrication of at least one transistor device that includes the fins 110 and the gate structure 190. These final process steps, and other back end process steps, will not be described here.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of manufacturing a finned semiconductor device structure, the method comprising:
   forming a semiconductor fin structure from a layer of semiconductor material;
   depositing an insulating material overlying the semiconductor fin structure such that the insulating material fills space adjacent to the semiconductor fin structure, resulting in deposited insulating material;
   creating a flat surface from the deposited insulating material, the flat surface being continuous with an upper surface of the semiconductor fin structure;
   fabricating a dummy gate structure overlying the flat surface, the dummy gate structure transversely overlying the semiconductor fin structure;
   after fabricating the dummy gate structure, depositing a spacer material overlying the dummy gate structure;
   after depositing the spacer material, anisotropically and selectively etching the deposited spacer material to form spacers adjacent to sidewalls of the dummy gate structure, wherein etching the deposited spacer material exposes some of the deposited insulating material and exposes some of the upper surface of the semiconductor fin structure;
   thereafter, removing the dummy gate structure while leaving the spacers substantially intact, to expose the flat surface between the spacers; and
   thereafter, selectively etching some of the deposited insulating material below an area defined between the spacers, and in a manner that is self-aligned with the spacers.

2. The method of claim 1, wherein forming the semiconductor fin structure comprises:
   forming a patterned hard mask overlying the layer of semiconductor material; and
   etching the layer of semiconductor material, using the patterned hard mask as an etch mask, such that the semiconductor fin structure comprises a fin formed from the layer of semiconductor material and a cap corresponding to the patterned hard mask.

3. The method of claim 2, wherein the creating step creates the flat surface such that the upper surface corresponds to a surface of the cap.

4. The method of claim 1, wherein forming the semiconductor fin structure comprises:
   providing a substrate having the layer of semiconductor material in the form of bulk semiconductor material; and
   etching the bulk semiconductor material to define the semiconductor fin structure and to create isolation trenches for the semiconductor fin structure in the bulk semiconductor material.

5. The method of claim 4, wherein the depositing step fills the isolation trenches with the insulating material.

6. The method of claim 1, wherein forming the semiconductor fin structure comprises:
   providing a semiconductor-on-insulator (SOI) substrate having the layer of semiconductor material overlying an insulator layer; and
   etching the layer of semiconductor material to define the semiconductor fin structure overlying the insulator layer.

7. The method of claim 1, wherein creating the flat surface comprises polishing the deposited insulating material, using the upper surface of the semiconductor fin structure as a polish stop indicator.

8. The method of claim 1, wherein:
   selectively etching some of the deposited insulating material defines a gate space for the finned semiconductor device structure; and
   the method further comprises forming a gate structure that occupies the gate space and the area defined between the spacers.

9. The method of claim 1, further comprising forming regions of dielectric material outboard the spacers, prior to removing the dummy gate structure.

10. The method of claim 1, wherein fabricating the dummy gate structure comprises:
    depositing at least one layer of dummy gate material overlying the flat surface;
    forming a dummy gate etch mask overlying the at least one layer of dummy gate material; and
    anisotropically etching the at least one layer of dummy gate material into a topology defined by the dummy gate etch mask.

11. A method of manufacturing a finned semiconductor device structure, the method comprising:
    providing a substrate having bulk semiconductor material;
    forming a semiconductor fin structure from the bulk semiconductor material;
    depositing an insulating material overlying the semiconductor fin structure such that the insulating material fills space adjacent to the semiconductor fin structure, resulting in deposited insulating material;
    planarizing the deposited insulating material and the semiconductor fin structure to create a flat surface; and thereafter, performing a replacement gate procedure to form a gate structure transversely overlying the semiconductor fin structure, wherein the replacement gate procedure comprises:
- fabricating a dummy gate structure overlying the flat surface, the dummy gate structure transversely overlying the semiconductor fin structure;
- after fabricating the dummy gate structure, depositing a spacer material overlying the dummy gate structure;
- after depositing the spacer material, anisotropically and selectively etching the deposited spacer material to form spacers adjacent to sidewalls of the dummy gate structure;
- after forming the spacers, forming source/drain cavities by etching unprotected portions of the semiconductor fin structure and by etching unprotected portions of the deposited insulating material to a desired depth such that no deposited insulating material remains overlying the bulk semiconductor material at the bottom of the formed source/drain cavities, and wherein the source/drain cavities are created using the spacers as part of an etch mask such that sidewalls of the source/drain cavities are self-aligned with the spacers.

12. The method of claim 11, wherein performing the replacement gate procedure further comprises:
- after forming the source/drain cavities, removing the dummy gate structure while leaving the spacers substantially intact, to expose the flat surface between the spacers; and
- thereafter, selectively etching some of the deposited insulating material below an area defined between the spacers, and in a manner that is self-aligned with the spacers.

13. The method of claim 12, wherein:
- selectively etching some of the deposited insulating material defines a gate space for the finned semiconductor device structure; and
- performing the replacement gate procedure further comprises forming the gate structure such that it occupies the gate space and the area defined between the spacers.

14. The method of claim 11, wherein:
- the semiconductor fin structure comprises a fin formed from the bulk semiconductor material and a hard mask cap overlying the fin; and
- planarizing the deposited insulating material results in removal of the hard mask cap.

15. The method of claim 11, wherein:
- the semiconductor fin structure comprises a fin formed from the bulk semiconductor material and a hard mask cap overlying the fin; and
- the method further comprises removing the hard mask cap from the fin prior to planarizing the deposited insulating material.

16. The method of claim 11, wherein:
- the semiconductor fin structure comprises a fin formed from the bulk semiconductor material and a hard mask cap overlying the fin; and
- the method further comprises removing the hard mask cap from the fin during the replacement gate procedure.

17. A method of manufacturing a finned semiconductor device structure, the method comprising:
- providing a substrate having bulk semiconductor material;
- forming a plurality of semiconductor fin structures from the bulk semiconductor material;
- creating isolation trenches in the bulk semiconductor material, the isolation trenches located between the plurality of semiconductor fin structures;
- filling the isolation trenches and covering the plurality of semiconductor fin structures with an insulating material, resulting in deposited insulating material;
- creating a flat surface from the deposited insulating material, the flat surface being continuous with upper surfaces of the plurality of semiconductor fin structures; and
- thereafter, performing a replacement gate procedure to form a gate structure transversely overlying the plurality of semiconductor fin structures, wherein performing the replacement gate procedure comprises:
  - fabricating a dummy gate structure overlying the flat surface, the dummy gate structure transversely overlying the plurality of semiconductor fin structures;
  - after fabricating the dummy gate structure, depositing a spacer material overlying the dummy gate structure;
  - after depositing the spacer material, anisotropically and selectively etching the deposited spacer material to form spacers adjacent to sidewalls of the dummy gate structure, wherein wherein etching the deposited spacer material exposes some of the deposited insulating material and exposes some of the upper surfaces of the semiconductor fin structures;
  - after forming the spacers, forming source/drain cavities by etching unprotected portions of the semiconductor fin structures and by etching unprotected portions of the deposited insulating material to a desired depth such that no deposited insulating material remains overlying the bulk semiconductor material at the bottom of the formed source/drain cavities, and wherein the source/drain cavities are created using the spacers as part of an etch mask such that sidewalls of the source/drain cavities are self-aligned with the spacers; and
  - thereafter, at least partially filling the source/drain cavities with a semiconductor material by selectively and epitaxially growing the semiconductor material from the bottom of the formed source/drain cavities.

18. The method of claim 17, wherein performing the replacement gate procedure further comprises:
- after at least partially filling the source/drain cavities with the semiconductor material, removing the dummy gate structure while leaving the spacers substantially intact, to expose the flat surface between the spacers;
- thereafter, selectively etching some of the deposited insulating material below an area defined between the spacers, and in a manner that is self-aligned with the spacers, to define a gate space for the finned semiconductor device structure; and
- forming the gate structure such that it occupies the gate space and the area defined between the spacers.

19. The method of claim 18, wherein the step of selectively etching some of the deposited insulating material is controlled such that an isolating layer of the deposited insulating material remains overlying the bulk semiconductor material and between the plurality of semiconductor fin structures.

* * * * *